United States Patent
Yamashita et al.

(10) Patent No.: US 9,865,631 B2
(45) Date of Patent: Jan. 9, 2018

(54) SOLID-STATE IMAGE PICKUP APPARATUS

(71) Applicant: CANON KABUSHIKI KAISHA, Tokyo (JP)

(72) Inventors: Yuichiro Yamashita, Ebina (JP); Masaya Ogino, Kawasaki (JP); Junji Iwata, Yokohama (JP); Kentarou Suzuki, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/972,510

(22) Filed: Dec. 17, 2015

(65) Prior Publication Data

US 2016/0104728 A1 Apr. 14, 2016

Related U.S. Application Data

(63) Continuation of application No. 13/515,786, filed as application No. PCT/JP2010/007224 on Dec. 13, 2010, now Pat. No. 9,245,919.

(30) Foreign Application Priority Data

Dec. 18, 2009 (JP) ................................ 2009-288461

(51) Int. Cl.
    *H01L 27/146* (2006.01)

(52) U.S. Cl.
    CPC ...... *H01L 27/1461* (2013.01); *H01L 27/1464* (2013.01); *H01L 27/14623* (2013.01);
    (Continued)

(58) Field of Classification Search
    CPC .......... H01L 27/1461; H01L 27/14634; H01L 27/14645
    See application file for complete search history.

(56) References Cited

U.S. PATENT DOCUMENTS

| 4,675,535 A * | 6/1987 | Tsunekawa | H04N 5/23212 250/208.1 |
| 6,864,557 B2 * | 3/2005 | Turner | H01L 27/14647 257/432 |

(Continued)

FOREIGN PATENT DOCUMENTS

| CN | 101281922 A | 10/2008 |
| JP | 2003-303949 A | 10/2003 |

(Continued)

*Primary Examiner* — John Lee
(74) *Attorney, Agent, or Firm* — Canon USA, Inc., IP Division

(57) ABSTRACT

Provided is a back-illuminated solid-state image pickup apparatus having an improved color separation characteristic. A photo detector includes a first photo detector unit and a second photo detector unit disposed deeper than the first photo detector unit with respect to a back surface of a semiconductor substrate, wherein the first photo detector unit includes a first-conductivity-type first semiconductor region where carriers generated through photo-electric conversion are collected as signal carriers. A readout portion includes a first-conductivity-type second semiconductor region extending in a depth direction such that the carriers collected in the first semiconductor region are read out to a front surface of the semiconductor substrate. A unit that reduces the amount of light incident on the second semiconductor region is provided.

19 Claims, 11 Drawing Sheets

(52) U.S. Cl.
CPC .. *H01L 27/14625* (2013.01); *H01L 27/14627* (2013.01); *H01L 27/14629* (2013.01); *H01L 27/14634* (2013.01); *H01L 27/14645* (2013.01); *H01L 27/14647* (2013.01); *H01L 27/14685* (2013.01)

(56) References Cited

U.S. PATENT DOCUMENTS

| | | | | |
|---|---|---|---|---|
| 7,479,997 B2* | 1/2009 | Hayakawa | ........ | H01L 27/14647 257/E27.135 |
| 7,625,774 B2* | 12/2009 | Lee | ........ | H01L 27/1463 257/E27.133 |
| 8,207,590 B2* | 6/2012 | Park | ........ | H01L 27/14621 257/444 |
| 8,816,460 B2* | 8/2014 | Kalevo | ........ | G01J 1/46 250/208.1 |
| 9,245,919 B2* | 1/2016 | Yamashita | ........ | H01L 27/14623 |
| 2003/0193586 A1 | 10/2003 | Hayakawa | | |
| 2003/0209651 A1* | 11/2003 | Iwasaki | ........ | H01L 27/302 250/214.1 |
| 2004/0178463 A1 | 9/2004 | Merrill | | |
| 2004/0238879 A1* | 12/2004 | Endoh | ........ | H01L 27/11556 257/315 |
| 2005/0087829 A1* | 4/2005 | Merrill | ........ | H01L 27/14603 257/440 |
| 2006/0033114 A1* | 2/2006 | Schranz | ........ | H01L 27/14621 257/88 |
| 2006/0033131 A1 | 2/2006 | Kim | | |
| 2006/0066131 A1* | 3/2006 | Nebel | ........ | B60P 3/39 296/156 |
| 2007/0092984 A1* | 4/2007 | Lee | ........ | H01L 27/14627 438/57 |
| 2007/0148808 A1* | 6/2007 | Lee | ........ | H01L 27/1463 438/69 |
| 2007/0228306 A1* | 10/2007 | Gannon | ........ | G06K 7/10722 250/555 |
| 2008/0265352 A1 | 10/2008 | Akiyoshi | | |
| 2008/0290382 A1* | 11/2008 | Hirota | ........ | H01L 27/14627 257/291 |
| 2009/0078974 A1* | 3/2009 | Nagai | ........ | H01L 27/14625 257/292 |
| 2009/0166518 A1 | 7/2009 | Tay | | |
| 2009/0256931 A1* | 10/2009 | Lee | ........ | H01L 24/97 348/231.99 |
| 2010/0006969 A1* | 1/2010 | Park | ........ | H01L 27/14621 257/446 |
| 2010/0252716 A1* | 10/2010 | Kalevo | ........ | G01J 1/46 250/208.1 |
| 2010/0330728 A1* | 12/2010 | McCarten | ........ | H01L 27/1464 438/70 |
| 2011/0242376 A1* | 10/2011 | Ando | ........ | H01L 27/14623 348/294 |
| 2012/0298841 A1* | 11/2012 | Yamashita | ........ | H01L 27/14623 250/208.1 |
| 2013/0032694 A1* | 2/2013 | Nakata | ........ | H04N 5/359 250/208.1 |
| 2014/0319324 A1* | 10/2014 | Kalevo | ........ | G01J 1/46 250/208.1 |
| 2016/0104728 A1* | 4/2016 | Yamashita | ........ | H01L 27/14623 257/292 |

FOREIGN PATENT DOCUMENTS

| | | |
|---|---|---|
| JP | 2005-209677 A | 8/2005 |
| JP | 2005-268643 A | 9/2005 |
| JP | 2007-066962 A | 3/2007 |
| JP | 2007-080926 A | 3/2007 |
| JP | 2007-324632 A | 12/2007 |
| JP | 2008-500723 A | 1/2008 |
| JP | 2008-060476 A | 3/2008 |
| JP | 2008-270679 A | 11/2008 |
| JP | 2009-088415 A | 4/2009 |
| JP | 2009-176777 A | 8/2009 |
| JP | 2009-295937 A | 12/2009 |
| JP | 2010-161254 A | 7/2010 |
| JP | 2011-029337 A | 2/2011 |
| TW | 200832688 | 8/2008 |
| WO | 2008/026660 A1 | 3/2008 |

* cited by examiner

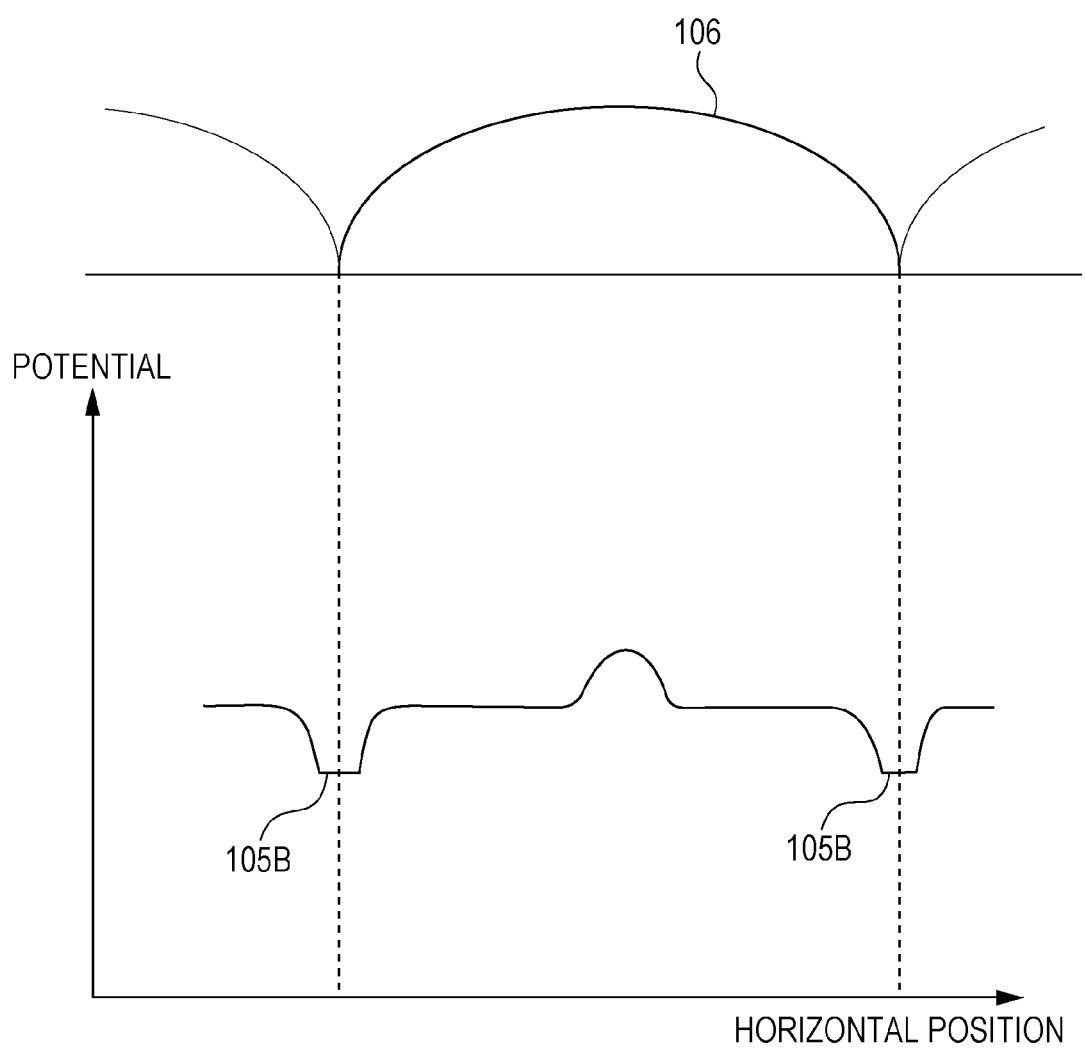

SOLID-STATE IMAGE PICKUP APPARATUS

CROSS-REFERENCE TO RELATED APPLICATION

This application is a Continuation of co-pending U.S. patent application Ser. No. 13/515,786 filed Jun. 13, 2012, which is a National Phase application of International Application PCT/JP2010/007224, filed Dec. 13, 2010, which claims the benefit of Japanese Patent Application No. 2009-288461, filed Dec. 18, 2009. The disclosures of the above-named applications are hereby incorporated by reference herein in their entirety.

TECHNICAL FIELD

The present invention relates to a back-illuminated solid-state image pickup apparatus and a camera system.

BACKGROUND ART

A back-illuminated solid-state image pickup apparatus according to the related art in which transistors and metal wires are arranged on a first main surface (front surface) of a semiconductor substrate and a second main surface (back surface) opposite to the front surface is illuminated with light has been proposed to provide a highly sensitive solid-state image pickup apparatus.

PTL 1 describes a back-illuminated solid-state image pickup apparatus having photo detectors stacked in the depth direction of a semiconductor substrate. The solid-state image pickup apparatus described in PTL 1 detects, at the respective photo detectors, light in wavelength bands corresponding to the respective depths of the photo detectors, employing the fact that optical absorption coefficient of the semiconductor substrate material is wavelength dependent. For example, when three photo detectors are stacked, the photo detector closest to the incident surface mainly detects blue light, the photo detector in the middle mainly detects green light, and the photo detector farthest from the incident surface mainly detects red light.

In the solid-state image pickup apparatus described in PTL 1, the photo detectors each have an impurity diffusion region extending in the depth direction for electrically connecting the photo detectors with circuits on the front surface.

With the configuration described in PTL 1, light enters the impurity diffusion regions extending in the depth direction of the semiconductor substrate. For example, when incident light is photo-electrically converted at a position deep in an impurity diffusion region corresponding to a blue photo detector, the generated carriers are accumulated as signal charges for blue. However, these carriers should actually be accumulated as signal carriers for green and red. By accumulating the carriers as signal carriers for blue, the color separation characteristic is aggravated, causing noise.

A front incident solid-state image pickup apparatus includes light-shielding structures, such as transistors and wires, on the light incident surface. In contrast, with a back incident solid-state image pickup apparatus, since transistors and wires are not required on the incident surface, light is incident on the entire back surface. Therefore, aggravation of the color separation characteristic becomes more obvious.

The present invention has been conceived in light of the problem described above and provides a back-illuminated solid-state image pickup apparatus having an improved color separation characteristic.

CITATION LIST

Patent Literature

[PTL 1]
Japanese Patent Laid-Open No. 2008-060476

SUMMARY OF INVENTION

A solid-state image pickup apparatus according to the present invention includes a semiconductor substrate including a plurality of pixels, each pixel including a photo detector and a readout portion; a wire disposed on a first main surface of the semiconductor substrate; and a light-level reducing portion, wherein light enters the photo detector from a second main surface of the semiconductor substrate opposite to the first main surface, wherein the photo detector includes a first photo detector unit and a second photo detector unit disposed deeper than the first photo detector unit with respect to the second main surface, wherein the first photo detector unit includes a first-conductive-type first semiconductor region in which carriers generated through photo-electric conversion are collected as signal carriers, wherein the readout portion includes a first-conductive-type second semiconductor region extending in a depth direction of the semiconductor substrate such that the carriers collected at the first semiconductor region are read out to the first main surface, wherein the light-level reducing portion is configured to reduce the amount of light incident on the first-conductive-type second semiconductor region, and wherein a light-level reduction ratio of the light-level reducing portion for light incident on the second semiconductor region is larger than the light-level reduction ratio of the light-level reducing portion for light incident on the first semiconductor region.

With the solid-state image pickup apparatus according to the present invention, it is possible to improve the color separation characteristic.

Further features of the present invention will become apparent from the following description of exemplary embodiments with reference to the attached drawings.

BRIEF DESCRIPTION OF DRAWINGS

FIG. 10 is a potential distribution diagram in the horizontal direction of the seventh embodiment.

DESCRIPTION OF EMBODIMENTS

Embodiments of the present invention will be described with reference to the drawings. In the embodiments, electrons are used as signal carriers. Holes may also be used as signal carriers. When using electrons as signal carriers, a first conductivity type is an n-type, and a second conductivity type is a p-type. When holes are used as signal carriers, the conductivity types of the semiconductor regions are set opposite to those when electrons are signal carriers.

First Embodiment

Figure 1:
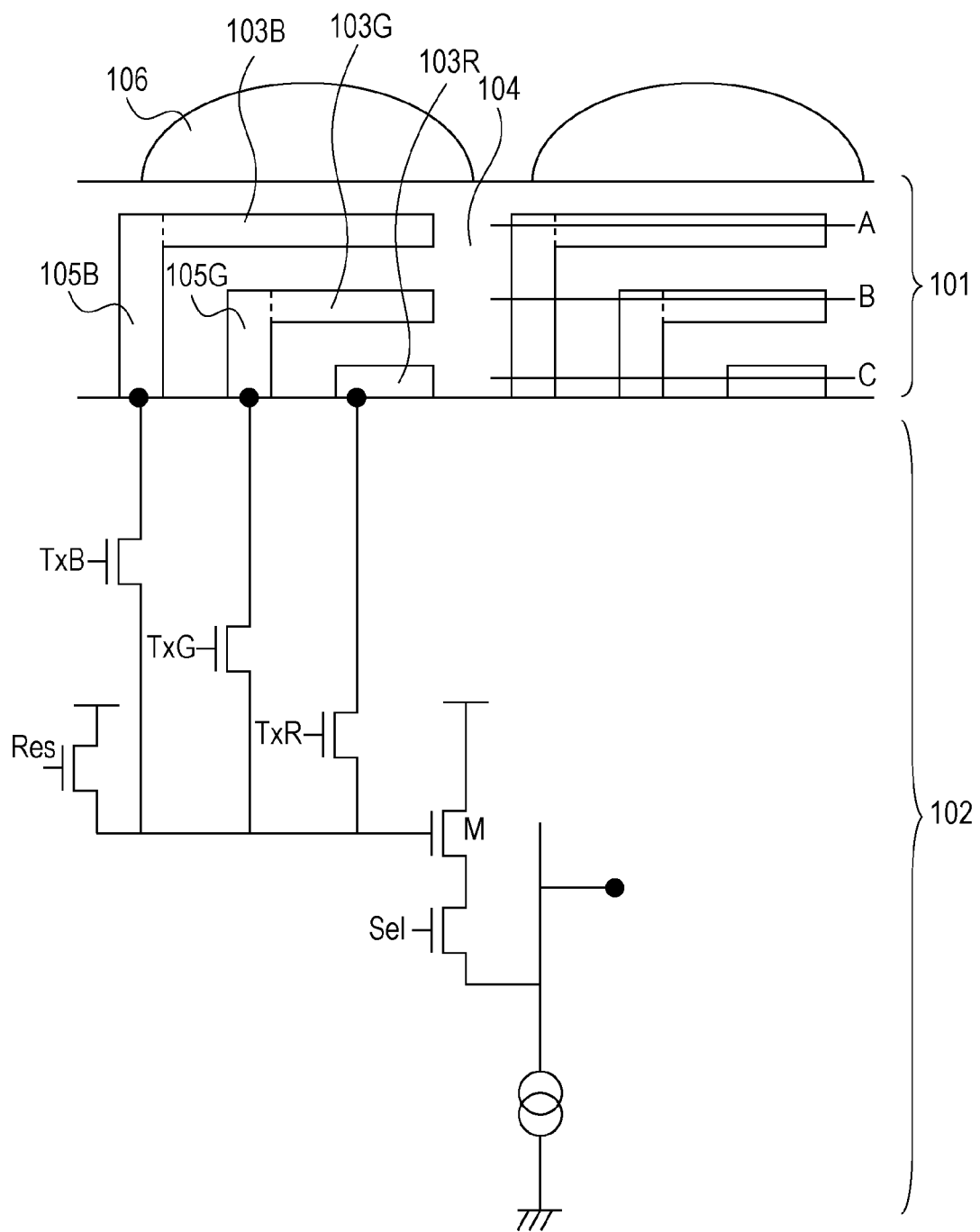
FIG. 1 is a schematic sectional view of a first embodiment.

FIG. 1 is a schematic sectional view of a solid-state image pickup apparatus according to a first embodiment of the present invention. Semiconductor regions, such as photo detectors and transistors, are included in the semiconductor substrate 101. A p-type semiconductor or an SOI substrate may be used as the semiconductor substrate 101. A circuit portion 102 is disposed on a first main surface (lower side in the drawing) of the semiconductor substrate 101. The circuit portion 102 includes transistors, electrodes, and wires. An optical function portion is disposed on a second main surface (upper side in the drawing), i.e., a side opposite to that on which the circuit portion 102 is disposed, with an insulating layer and a protective layer interposed between the optical function portion and the second main surface. In the back-illuminated solid-state image pickup apparatus according to this embodiment, light enters from the surface opposite to the first main surface (front surface) on which wires and transistors are disposed, i.e., from the second main surface (back surface).

In this embodiment, the optical function portion includes a microlens. As described in detail below, the microlens functions as a light-level reducing portion.

Next, the structure of a photo detector disposed on the semiconductor substrate 101 will be described. As illustrated in FIG. 1, n-type semiconductor regions 103B, 103G, and 103R are stacked in the depth direction in the semiconductor substrate 101. In this specification, the depth direction is a direction perpendicular to the front surface or back surface of the substrate. The horizontal direction is a direction orthogonal to the depth direction.

The n-type semiconductor regions 103B, 103G, and 103R each form a p-n junction with a p-type semiconductor region 104. In the n-type semiconductor region 103B closest to the back surface, electrons that are generated through photo-electric conversion of light in the blue wavelength band are mainly collected. In the n-type semiconductor region 103G disposed deeper than the n-type semiconductor region 103B with respect to the back surface, electrons generated through photo-electric conversion of light in the green wavelength band are mainly collected. In the n-type semiconductor region 103R disposed deepest with respect to the back surface, electrons generated through photo-electric conversion of light in the red wavelength band are mainly collected. In this embodiment, the n-type semiconductor region 103B is equivalent to a first semiconductor region according to the present invention, and the n-type semiconductor region 103G is equivalent to a third semiconductor region according to the present invention.

In this way, each of the n-type semiconductor regions 103B, 103G, and 103R together with the p-type semiconductor region 104 constitute a photo detector, or, specifically, a photodiode. In each photo detector, light in a wavelength region corresponding to the depth of the photo detector is detected.

N-type semiconductor regions 105B and 105G are readout portions that extract the carriers collected in the n-type semiconductor regions 103B and 103G, respectively. The n-type semiconductor region 105B extends in the depth direction of the semiconductor substrate 101 from the n-type semiconductor region 103B to the front surface. The n-type semiconductor region 105G extends in the depth direction of the semiconductor substrate 101 from the n-type semiconductor region 103G to the front surface. It is desirable that the impurity concentrations of the n-type semiconductor regions 105B and 105G be respectively higher than those of the n-type semiconductor regions 103B and 103G. In this embodiment, the n-type semiconductor region 105B is equivalent to a second semiconductor region according to the present invention, and the n-type semiconductor region 105G is equivalent to a fourth semiconductor region according to the present invention.

In this embodiment, since the n-type semiconductor region 103R corresponding to the red wavelength band is disposed at the front surface, the readout portion corresponding to the n-type semiconductor region 103R can be omitted. The n-type semiconductor region 103R may also be embedded into the semiconductor substrate 101 such that it is not exposed at the front surface. In such a case, a readout portion corresponding to the n-type semiconductor region 103R should be provided.

Each readout portion is not limited to such shape and position so long as it has a function for extracting signals based on electrons generated at the photo detectors to the front surface via a readout portion.

In this embodiment, the three n-type semiconductor regions 103B, 103G, and 103R, which are stacked in the depth direction, and the n-type semiconductor regions 105B and 105G are all included in a single pixel. Although only two pixels are illustrated in FIG. 1, actually, multiple pixels are arranged in a line or in a matrix. This is also the true for the other embodiments described below.

The circuit portion 102 includes a circuit that reads out signals based on electrons generated at the photo detectors. An example configuration of the circuit portion 102 will be described in detail.

The n-type semiconductor regions 105B and 105G and the n-type semiconductor region 103R are electrically connected with the input of an amplifier via transfer MOS transistors TxB, TxG, and TxR. The input of the amplifier can be connected to a power source via a reset MOS transistor Res. By turning on the transfer MOS transistors, fully depleted transfer of the electrons generated at the photo detectors can be performed to the input of the amplifier via the readout portions.

The amplifier is an amplifier MOS transistor M. The gate of the amplifying MOS transistor M is the input. One of the source and drain is connected to the power source, and the other is connected to the source or the drain of a selector MOS transistor SEL. One of the source and drain of the selector MOS transistor SEL that is not connected to the amplifier MOS transistor M is connected to an output line.

The configuration is not limited thereto, and the semiconductor regions may be electrically connected directly with the output lines.

Microlenses 106 that collect light are disposed on the back surface of the semiconductor substrate 101. The microlenses 106 are disposed at positions corresponding to the positions of the photo detectors. In this embodiment, one microlens 106 is disposed for each group of three stacked photo detectors. In other words, the projection of the microlens 106 in the depth direction covers the photo detectors. In this embodiment, an edge of the microlens 106 is positioned above the n-type semiconductor region 105B. In other words, the projection of the microlens 106 in the depth direction overlaps the n-type semiconductor region 105B. The microlens 106 may be disposed a certain distance away from the back surface or may be disposed directly on the back surface.

Incident light converges at the center of the microlens 106. Therefore, the amount of light incident on the n-type semiconductor region 105B disposed below the edge of the microlens 106 is reduced from that when the microlens 106 is not provided. The reduction ratio of the amount of incident light is the ratio of the reduction amount by providing the microlens 106 to the amount of the incident light when the microlens 106 is not provided.

The amount of light incident on the n-type semiconductor region 103B is substantially unchanged or is increased by converging at the microlens 106. In other words, the reduction ratio is substantially zero, or the amount of incident light does not decrease but, instead, increases.

In this way, with the light-level reducing portion according to the present invention, the reduction ratio of the amount of incident light on the second semiconductor region is larger than the reduction ratio of the amount of incident light on the first semiconductor region. The amount of light incident on the first semiconductor region is not reduced at all or, instead, may be increased. The light-level reducing portion may completely block the light incident on the second semiconductor region such that the amount of light incident on the second semiconductor region is zero.

Figure 2:
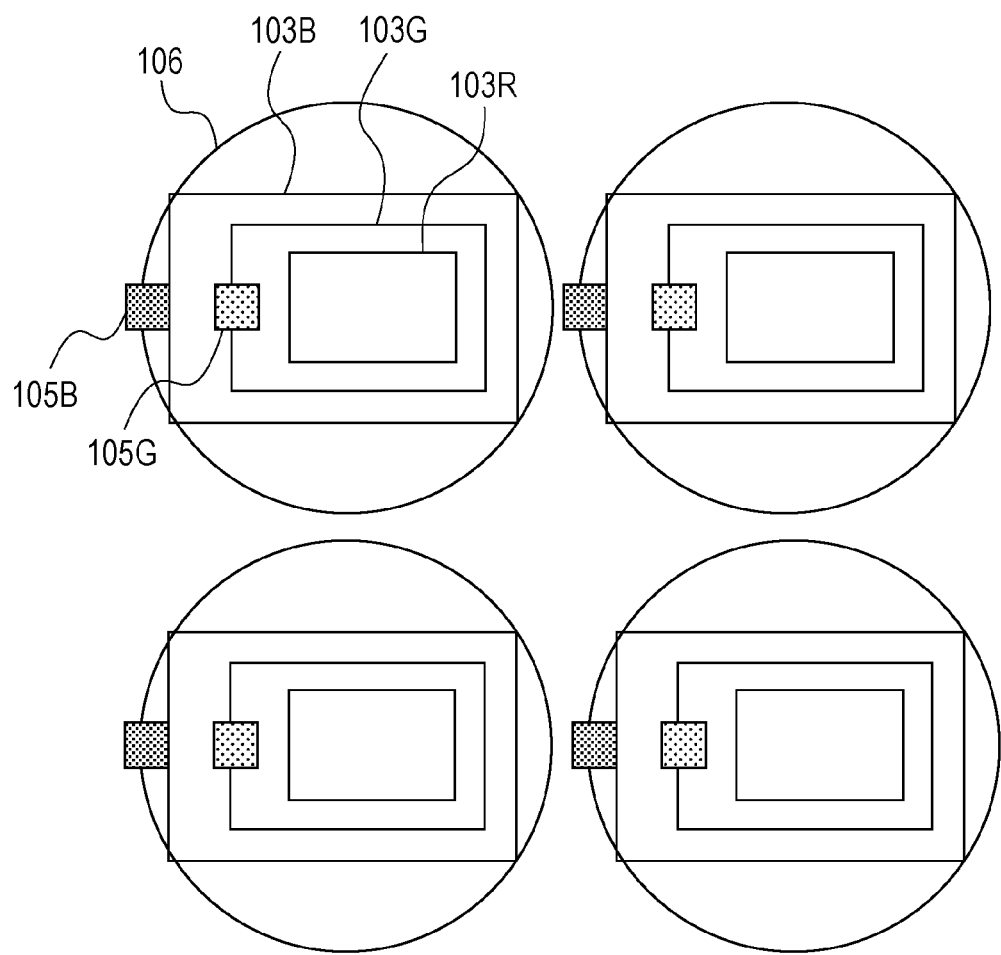
FIG. 2 is a schematic top view of the first embodiment.

FIG. 2 is a top view of this embodiment. FIG. 2 illustrates the n-type semiconductor regions 103B, 103G, and 103R and the n-type semiconductor regions 105B and 105G.

As illustrated in the drawing, the projections of the three n-type semiconductor regions 103B, 103G, and 103R in the depth direction overlap. The n-type semiconductor regions 105B and 105G, which are readout portions, are disposed to correspond to the n-type semiconductor regions 103B, 103G, respectively. When viewed from the top, the n-type semiconductor regions 103B, 103G, and 103R are overlaid with the microlens 106.

When viewed from the top, the edge of the microlens 106 intersects the n-type semiconductor region 105B. In other words, the projection of the microlens 106 in the depth direction overlaps the n-type semiconductor region 105B.

In this embodiment, the n-type semiconductor region 103B disposed closest to the back surface has the largest area on a horizontal plane. The microlens 106 is disposed such that its center substantially matches the center of the n-type semiconductor region 103B.

Figure 3:
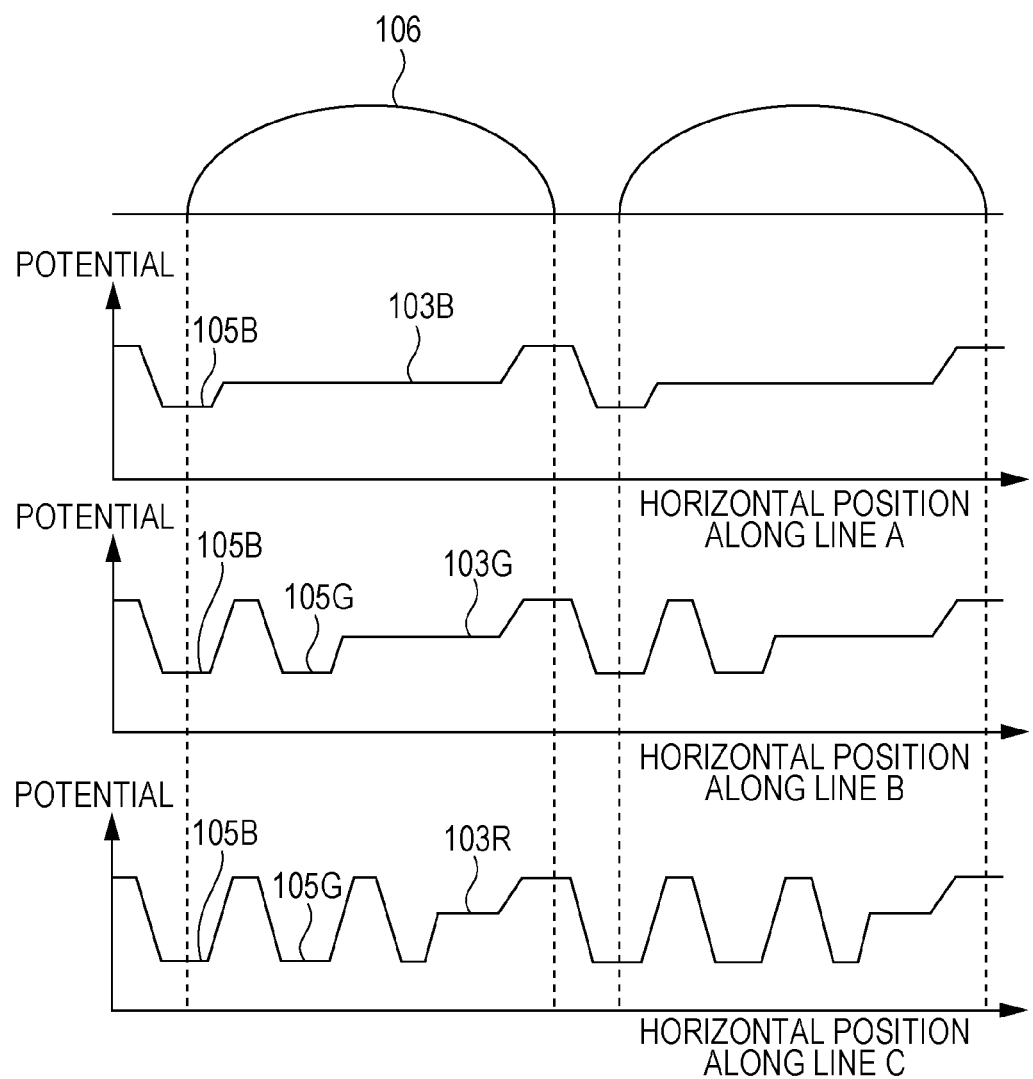
FIG. 3 is a potential distribution diagram in the horizontal direction of the first embodiment.

FIG. 3 is a potential distribution diagram of this embodiment in the horizontal direction. FIG. 3 illustrates the potential distribution in the horizontal direction at depths corresponding to the positions of the n-type semiconductor regions 103B, 103G, and 103R. In other words, FIG. 3 illustrates the potential distributions along lines A, B, and C in FIG. 1. The vertical axis represents the potential of electrons, and the horizontal axis represents the horizontal position.

As illustrated in FIG. 3, a potential barrier formed by the p-type semiconductor region 104 is interposed between the n-type semiconductor regions 103B of adjoining pixels. The potential of the n-type semiconductor region 105B, which is a readout portion, is lower than the potential of the n-type semiconductor region 103B. At this depth, light mainly in the blue wavelength region is photo-electrically converted and is collected in the n-type semiconductor region 103B as blue signal carriers.

When there is a flat section in the potential barrier between the pixels, carriers generated in this flat section diffuses to the depth direction and may enter the n-type semiconductor region 103G. Therefore, it is desirable that the n-type semiconductor region 103B widely extend in the horizontal direction. By reducing the distance between n-type semiconductor regions 103B in adjoining pixels, the flat section in the potential barrier becomes small, and, thus, the electrons reach the n-type semiconductor region 103B more easily than reaching the n-type semiconductor region 103G. That is, color mixing within a pixel can be prevented.

Another method of preventing color mixing will be described. The microlens 106 is disposed such that its center matches the center of the n-type semiconductor region 103B, and light is allowed to enter the n-type semiconductor region 103B. In this way, the amount of light entering the potential barrier interposed between adjoining pixels decreases, and, as a result, the amount of electrons that may enter the above-described n-type semiconductor region 103G is reduced.

FIG. 3 illustrates a potential distribution in the horizontal direction at the depth corresponding to the position of the n-type semiconductor region 103G. The n-type semiconductor region 105G, which is the readout portion, has a potential lower than that of the n-type semiconductor region 103G.

A potential barrier is formed between the n-type semiconductor region 105G and the n-type semiconductor region 105B. It is desirable that the n-type semiconductor region 105G and the n-type semiconductor region 105B be electrically separated in this way.

At this depth, light mainly in the green wavelength band is photo-electrically converted and collected in the n-type semiconductor region 103G as green signal carriers. On the other hand, when light is incident on the n-type semiconductor region 105B, the carriers generated by photo-electric conversion is collected as blue signal carriers.

In this embodiment, since the horizontal positional relationship is such that the edge of the microlens 106 is disposed above the n-type semiconductor region 105B, the amount of light incident on the n-type semiconductor region 105B decreases. Therefore, carriers to be collected as green signal carriers less likely enter the n-type semiconductor region 105B.

FIG. 3 illustrates a potential distribution in the horizontal direction at a depth corresponding to the position of the n-type semiconductor region 103R. As illustrated in FIG. 3, potential barriers are formed between the n-type semiconductor region 105B and the n-type semiconductor region 105G, and between the n-type semiconductor region 105G and the n-type semiconductor region 103R. It is desirable that the n-type semiconductor region 105B, the n-type semiconductor region 105G, and the n-type semiconductor region 103R be electrically separated in this way.

At this depth, light mainly in the red wavelength band is photo-electrically converted and collected in the n-type semiconductor region 103R as red signal carriers. By disposing the microlens 106, red signal carriers less likely enter the n-type semiconductor region 105B.

As described above, in this embodiment, the projection of the edge of the microlens 106 in the depth direction overlaps the n-type semiconductor region 105B. In other words, when viewed from the top, the n-type semiconductor region 105B is overlaid with the microlens 106. Since the amount of light incident on the n-type semiconductor region 105B decreases in such a configuration, carriers are less likely generated at a deep position relative to the back surface of the n-type semiconductor region 105B. Consequently, the color separation characteristic is improved.

In this embodiment, the center of the n-type semiconductor region 103B substantially matches the center of the microlens 106 on the horizontal plane. With such a configuration, carriers are less likely generated in the region between the n-type semiconductor regions 103B in adjoining pixels. Consequently, the color separation characteristic is improved.

Second Embodiment

Figure 4:
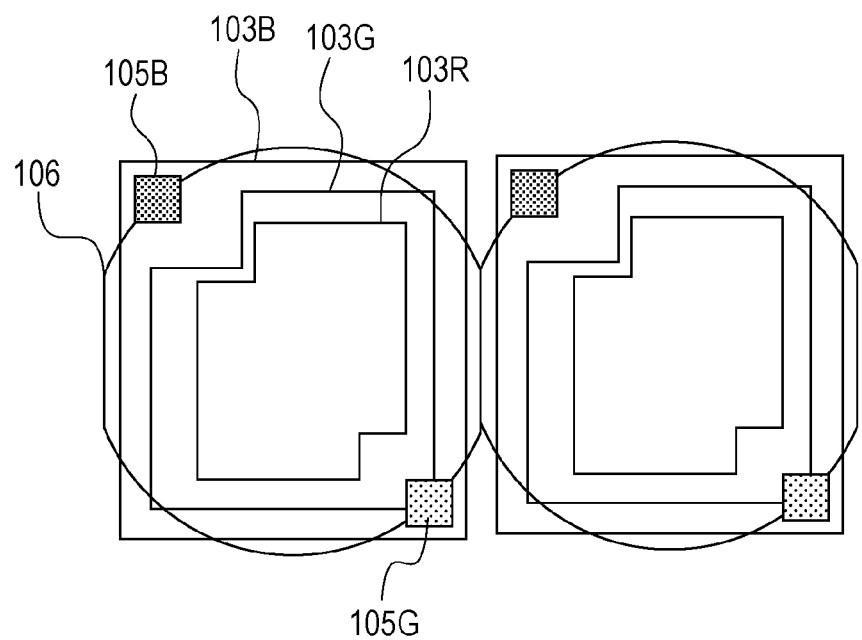
FIG. 4 is a schematic top view of a second embodiment.

A solid-state image pickup apparatus according to another embodiment of the present invention is illustrated in FIG. 4. FIG. 4 is a top view of the solid-state image pickup apparatus. Components that have the same functions as those in the first embodiment will be represented by the same reference numerals, and detailed descriptions thereof will not be repeated.

In this embodiment, when viewed from the top, the edge of the microlens 106 intersects the n-type semiconductor region 105B and the n-type semiconductor region 105G. The microlenses 106 in adjoining pixels are disposed in a connected manner such that they share part of their edge. In this way, when part or all of a microlens 106 is connected with the microlens 106 of the adjoining pixel, a section that appears as a valley in a sectional view also correspond to the edge of the microlens 106. It is desirable that the edge shared by adjoining microlenses 106 be positioned above the n-type semiconductor regions 105B and 105G.

Similar to the n-type semiconductor region 105B according to the first embodiment, in this embodiment, the amount of light incident on the n-type semiconductor region 105G decreases. Therefore, the amount of carriers generated in the n-type semiconductor region 105G at a depth corresponding to the position of the n-type semiconductor region 103R decreases. That is, carriers to be collected as red signal carriers are less likely collected as green carriers.

In addition to the above-described advantages of the first embodiment, this embodiment has the following advantage.

In this embodiment, when viewed from the top, the edge of the microlens 106 intersects the n-type semiconductor region 105B and the n-type semiconductor region 105G. Since the amount of light incident on the n-type semiconductor region 105G can be reduced with such a configuration, carriers are less likely generated at a position deep with respect to the back surface of the n-type semiconductor region 105G. Consequently, the color separation characteristic is improved.

Third Embodiment

Figure 5:
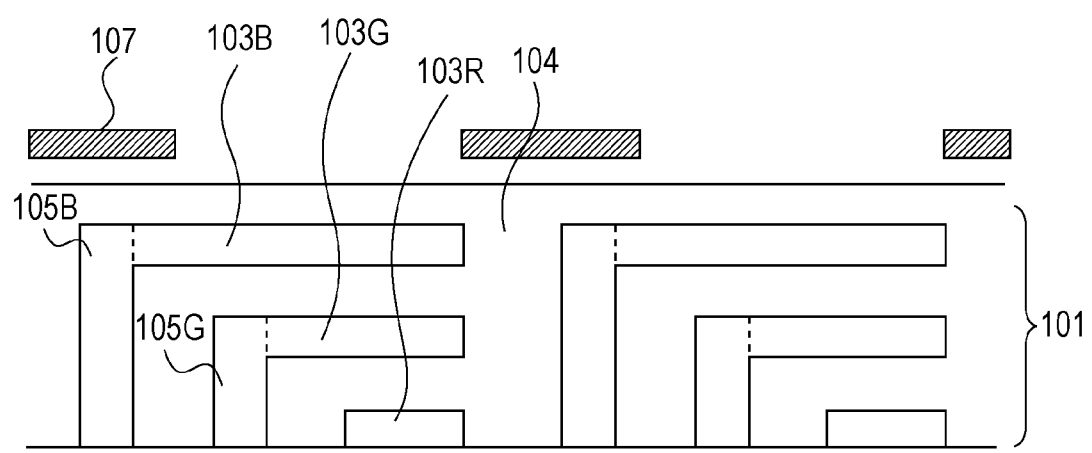
FIG. 5 is a schematic sectional view of a third embodiment.

FIG. 5 is a schematic sectional view of a solid-state image pickup apparatus according to another embodiment of the present invention. Components that have the same functions as those in the first or second embodiment will be represented by the same reference numerals, and detailed descriptions thereof will not be repeated.

The configuration according to this embodiment includes light-shielding portions 107 on the back surface, which is the light incident surface. As described below, in this embodiment, the light-shielding portions 107 function as light-level reducing portions.

The light-shielding portions 107 are made of a material that does not transmit light. For example, a metal such as aluminum is used. Instead, a light-absorbing material, such as black-colored resin, may be used. Each light-shielding portion 107 is disposed above the n-type semiconductor region 105B. The horizontal positional relationship is determined such that the projection of the light-shielding portion 107 in the depth direction overlaps the n-type semiconductor region 105B. The light-shielding portion 107 may be positioned such that at least part of the incident light is blocked.

The light-shielding portion 107 blocks part of the incident light, and thus, the amount of light incident on the n-type semiconductor region 105B decreases. Photo-electric conversion of light in the green wavelength band and red wavelength band is less likely performed in deep sections of the n-type semiconductor region 105B. As a result, the carriers that should be readout as green or red signal carriers are less likely read out as blue signal carriers.

The light-shielding portion 107 may be interposed between the n-type semiconductor regions 103B of adjoining pixels. In this way, the amount of light incident on the region between the n-type semiconductor regions 103B of adjoining pixels can be reduced, and thus, the amount of carriers generated at a depth corresponding to the position of the n-type semiconductor region 103B and entering the n-type semiconductor region 103G decreases.

As described above, in this embodiment, the projection of the light-shielding portion 107 in the depth direction overlaps the n-type semiconductor region 105B. In other words, when viewed from the top, the n-type semiconductor region 105B is overlaid with the light-shielding portion 107. Since the amount of light incident on the n-type semiconductor region 105B can be reduced with such a configuration, the generation of carriers at a deep position with respect to the back surface of the n-type semiconductor region 105B can be suppressed. Consequently, the color separation characteristic is improved.

By interposing the light-shielding portion 107 between the n-type semiconductor regions 103B of adjoining pixels, the generation of carriers between the n-type semiconductor regions 103B of adjoining pixels can be suppressed. Consequently, the color separation characteristic is improved even more.

In addition to the configuration according to this embodiment, by combining the microlenses according to the first or second embodiment, the color separation characteristic can be improved even more.

Fourth Embodiment

Figure 6:
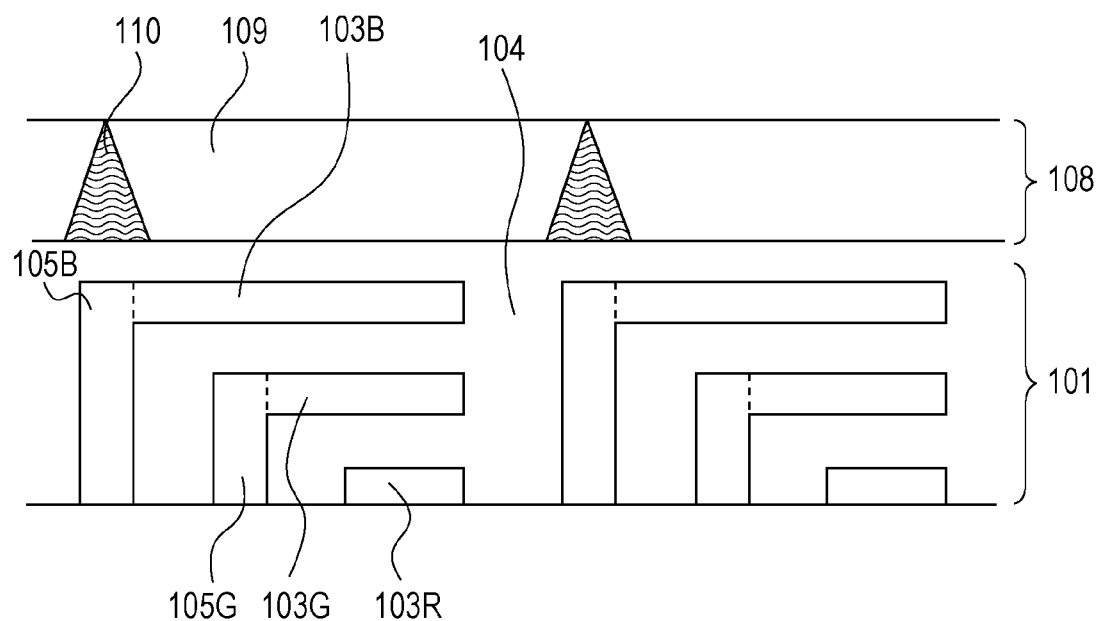
FIG. 6 is a schematic sectional view of a fourth embodiment.

FIG. 6 is a schematic sectional view of a solid-state image pickup apparatus according to another embodiment of the present invention. Components that have the same functions as those in the first to third embodiments will be represented by the same reference numerals, and detailed descriptions thereof will not be repeated.

In this embodiment, an optical waveguide 108 is disposed on the back surface, which is the light incident surface. As described below, the optical waveguide 108 according to this embodiment function as a light-level reducing portion.

The optical waveguide 108 includes a core portion 109 and clad portions 110. It is desirable that the core portion 109 be made of a material that transmits light and has a small index of refraction. The clad portions 110 are made of a material that has an index of refraction larger than that of the core portion 109. Instead, a material that reflects light may be used.

In this embodiment, each clad portion 110 is positioned above the n-type semiconductor region 105B. The projection of the clad portion 110 in the depth direction overlaps the n-type semiconductor region 105B.

Since incident light is reflected at the clad portion 110, the amount of light incident on the n-type semiconductor region 105B decreases. Therefore, photo-electric conversion of light in the green wavelength band and red wavelength band is less likely performed in deep sections of the n-type semiconductor region 105B. As a result, the carriers that should be readout as green or red signal carriers are less likely read out as blue signal carriers.

In this embodiment, by forming the optical waveguide 108 long in the depth direction, the directionality of the incident light is improved. Light that enters the optical waveguide 108 at a certain incident angle is reflected at and interferes with the clad portions 110. When the light reaches the second main surface of the semiconductor substrate, the influence of the incident angle is weakened, and the light becomes substantially parallel.

When a large amount of the incident light is oblique, the solid-state image pickup apparatus including stacked photo detectors will have an unsatisfactory color separation characteristic. Therefore, by using an optical waveguide that is long in the depth direction, the color separation characteristic can be improved.

As described above, in this embodiment, the projection of the clad portion 110 in the depth direction overlaps the n-type semiconductor region 105B. That is, when viewed from the top, the n-type semiconductor region 105B is overlaid with the clad portion 110. Since the amount of light incident on the n-type semiconductor region 105B can be reduced with such a configuration, the generation of carriers at a deep position with respect to the back surface of the n-type semiconductor region 105B can be suppressed. Consequently, the color separation characteristic is improved.

In addition to the configuration according to this embodiment, by combining the microlenses according to the first or second embodiment, the color separation characteristic can be improved even more.

Fifth Embodiment

Figure 7:
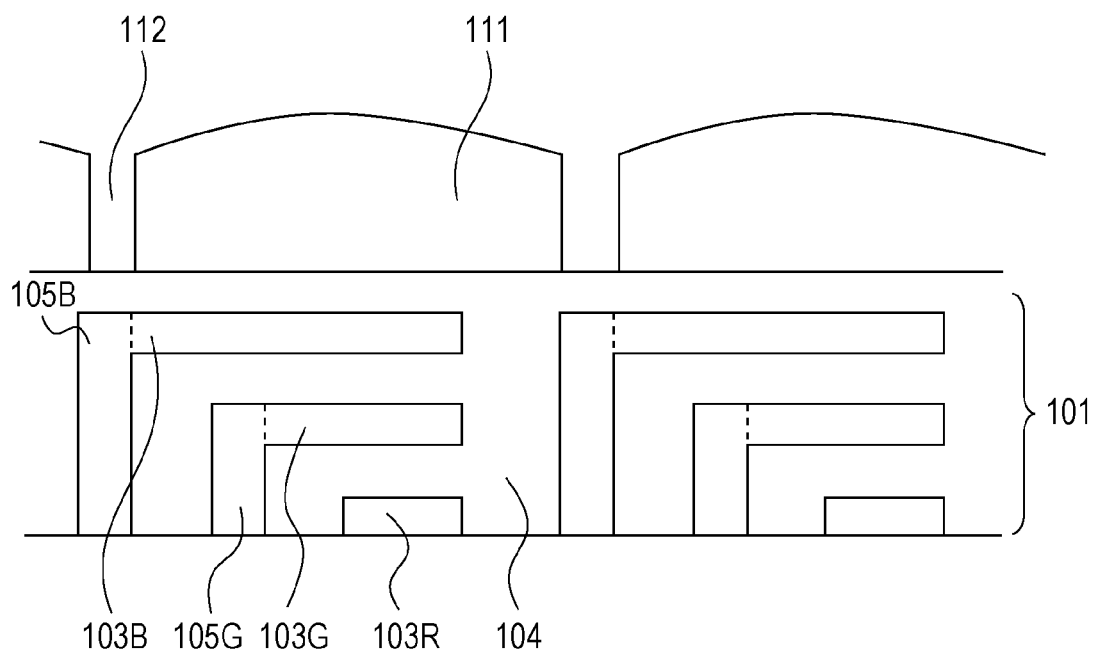
FIG. 7 is a schematic sectional view of a fifth embodiment.

FIG. 7 is a schematic sectional view of a solid-state image pickup apparatus according to another embodiment of the present invention. Components that have the same functions as those in the first to fourth embodiments will be represented by the same reference numerals, and detailed descriptions thereof will not be repeated.

In this embodiment, a pillar-type microlens 111 is disposed on the back surface for each pixel. As described below, in this embodiment, the pillar-type microlenses 111 function as light-level reducing portions.

An air gap 112 is formed between the microlenses 111 of adjoining pixels. The projection of the air gap 112 in the depth direction overlaps the n-type semiconductor region 105B. That is, when viewed from the top, the n-type semiconductor region 105B is overlaid with the air gap 112.

The air gap 112 is a vacuum or is filled with nitrogen or air. The difference in the indices of refraction of the air gap 112 and the pillar-type microlens 111 causes the light incident on the air gap 112 to converge into the microlens 111.

Since the air gap 112 is disposed above the n-type semiconductor region 105B, the amount of light incident on the n-type semiconductor region 105B can be reduced. Therefore, photo-electric conversion of light in the green wavelength band and red wavelength band is less likely performed in deep sections of the n-type semiconductor region 105B. As a result, the carriers that should be read out as green or red signal carriers are less likely read out as blue signal carriers.

Since the microlens 111 is pillar-type, the directionality of the incident light is improved. Light that enters the microlens 111 at a certain incident angle is reflected at and interferes with the air gap 112. When the light reaches the second main surface of the semiconductor substrate, the influence of the incident angle is weakened, and the light becomes substantially parallel.

When a large amount of the incident light is oblique, the solid-state image pickup apparatus including stacked photo detectors will have an unsatisfactory color separation characteristic. Therefore, by using microlenses having excellent directionality of light, the color separation characteristic can be improved.

As described above, in this embodiment, the projection of the air gap 112 formed between the pillar-type microlenses in the depth direction overlaps the n-type semiconductor region 105B. That is, when viewed from the top, the n-type semiconductor region 105B is overlaid with the air gap 112.

Since the amount of light incident on the n-type semiconductor region 105B can be reduced with such a configuration, the generation of carriers in a deep position with respect to the back surface of the n-type semiconductor region 105B can be suppressed. Consequently, the color separation characteristic is improved.

In addition to the configuration according to this embodiment, by combining the light-level reducing portions of the third embodiment and/or the optical waveguide of the fourth embodiment, the color separation characteristic is improved even more.

Sixth Embodiment

Figure 8A:
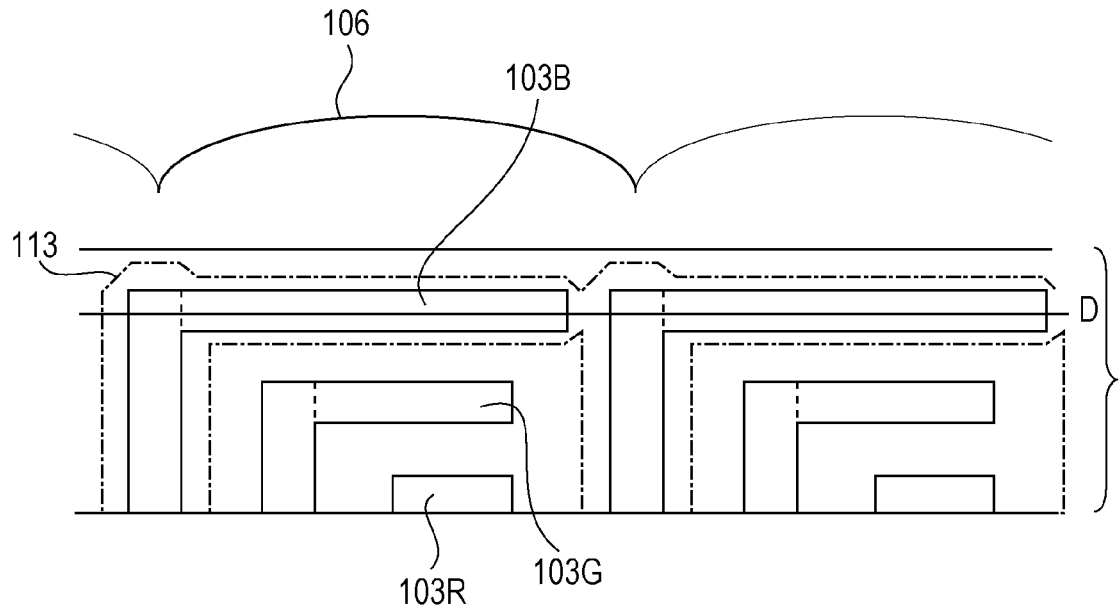
FIG. 8A is a schematic sectional view of a sixth embodiment.

FIG. 8A is a schematic sectional view of a solid-state image pickup apparatus according to another embodiment of the present invention. Components that have the same functions as those in the first to fifth embodiments will be represented by the same reference numerals, and detailed descriptions thereof will not be repeated.

In this embodiment, the n-type semiconductor regions 103B of adjoining pixels are electrically conductive. The n-type semiconductor regions 103B may be electrically conductive when a p-type semiconductor region is not provided between the n-type semiconductor regions 103B. Even when a p-type semiconductor region is provided, the n-type semiconductor regions 103B may be electrically conductive when the n-type semiconductor regions 103B are sufficiently close to each other and connected with a depletion layer.

In FIG. 8A, a depletion layer 113 extending from the n-type semiconductor regions 103B is indicated by dotted lines. As illustrated in FIG. 8A, the n-type semiconductor regions 103B of adjoining pixels are electrically conductive via the depletion layer 113.

Figure 8B:
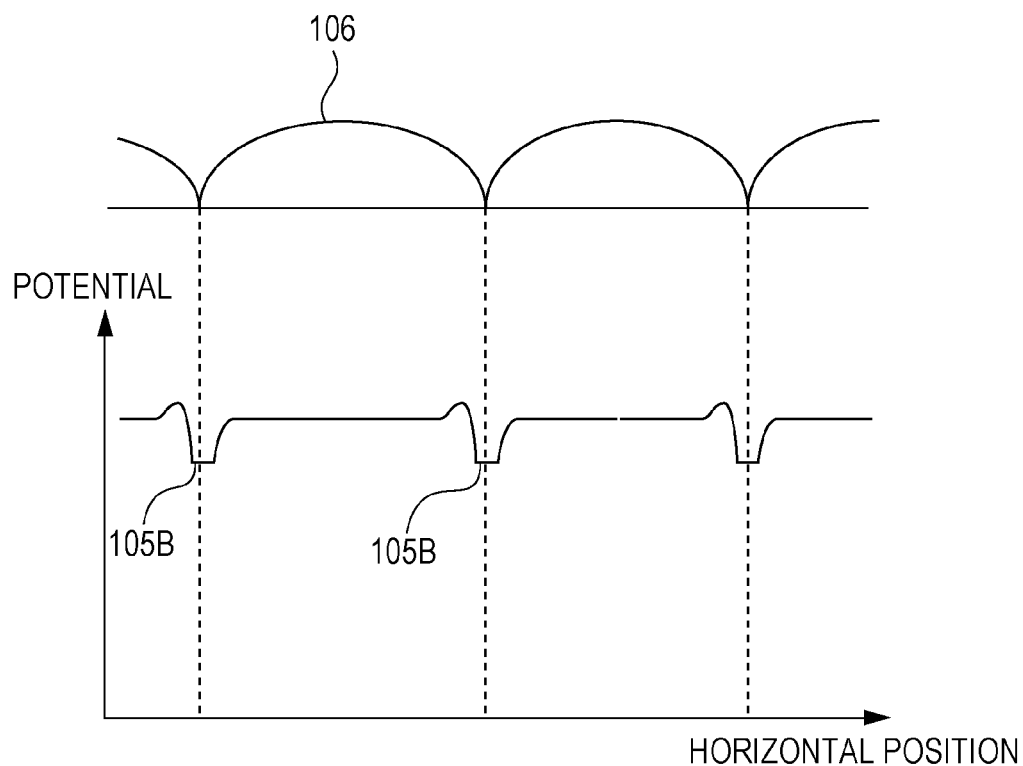
FIG. 8B is a potential distribution diagram in the horizontal direction of the sixth embodiment.

FIG. 8B illustrates a potential distribution in the horizontal direction at a depth corresponding to the position of the n-type semiconductor regions 103B. That is, FIG. 8B illustrates the potential distribution along line D in FIG. 8A. In FIG. 8B, the vertical axis represents the potential of electrons, and the horizontal axis represents the horizontal position.

As illustrated in FIG. 8B, a potential barrier formed between the n-type semiconductor regions 103B of two different pixels does not have a flat section. In other words, the potential barrier formed between the n-type semiconductor regions 103B of two different pixels has a potential gradient that causes carriers to drift toward one of the pixels in the horizontal direction.

When there is a flat section in the potential barrier, as described in the first embodiment, carriers enter the n-type semiconductor regions 103G. In this embodiment, since the potential barrier has substantially no flat sections, carriers less likely enter the n-type semiconductor regions 103G.

When an impurity diffusion region extends across adjoining pixels, a potential barrier is formed in the depth direction also in the region between the n-type semiconductor regions 103B of the adjoining pixels. Consequently, carriers less likely enter the n-type semiconductor regions 103G.

FIG. 8A illustrates microlenses 106, which are similar to those of the first embodiment, disposed on the back surface. In this embodiment, the configuration is not limited thereto, and configurations of other embodiments may be employed.

As described above, in addition to the advantages of the first to fifth embodiments, this embodiment has the following advantage.

In this embodiment, the n-type semiconductor regions 103B of adjoining pixels are electrically conductive. With such a configuration, carriers that are generated between the n-type semiconductor regions 103B of adjoining pixels less likely enter the n-type semiconductor regions 103G. Consequently, the color separation characteristic is improved even more.

In this embodiment, the n-type semiconductor regions 103B are electrically conductive. Instead, however, the n-type semiconductor regions 103G of adjoining pixels may be electrically conductive in a similar manner. In such a case, carriers that are generated in the region between the n-type semiconductor regions 103G of adjoining pixels less likely enter the n-type semiconductor regions 103B and the n-type semiconductor regions 103R.

Seventh Embodiment

Figure 9A:
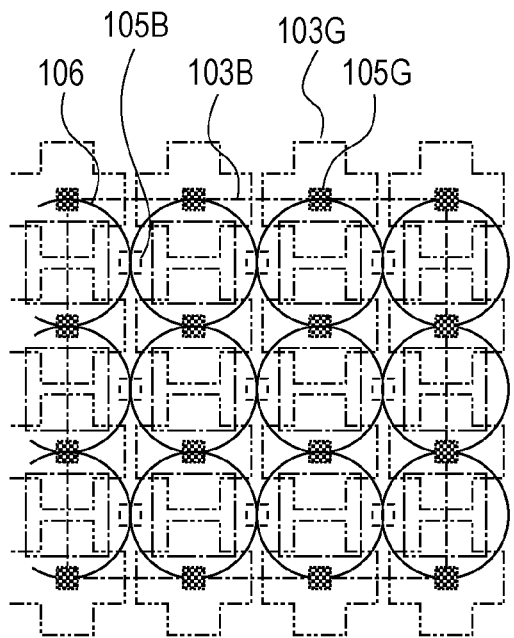
FIG. 9A is a schematic top view of a seventh embodiment.

FIG. 9A is a top view of a solid-state image pickup apparatus according to another embodiment of the present invention. Components that have the same functions as those in the first to sixth embodiments will be represented by the same reference numerals, and detailed descriptions thereof will not be repeated.

In this embodiment, when viewed from the top, the edge of the microlens 106 intersects the center of the n-type semiconductor region 103B. In addition, when viewed from the top, the edge of the microlens 106 intersects the center of the n-type semiconductor region 103G. In other words, one microlens 106 is disposed above two n-type semiconductor regions 103B. That is, the projection of the microlens 106 in the depth direction overlaps two of the n-type semiconductor regions 103B. This is also the same for the n-type semiconductor regions 103G.

The n-type semiconductor regions 105B and 105G, which are readout portions, are disposed at the centers of the n-type semiconductor regions 103B and 103G, respectively. In other words, the projection of the edge of the microlens 106 in the depth direction intersects the n-type semiconductor regions 105B and 105G.

Figure 9B:
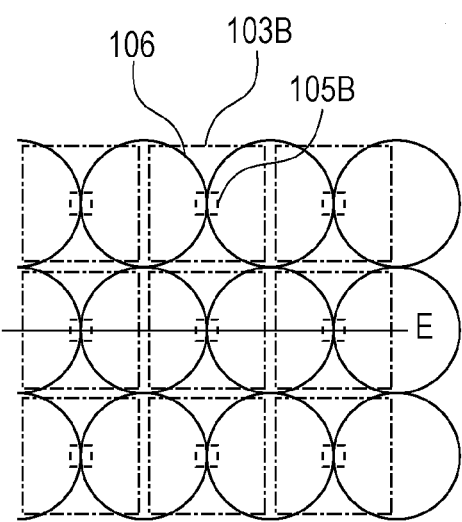
FIG. 9B is a schematic top view of photo detectors and microlenses corresponding to blue light according to the seventh embodiment.

FIG. 9B is a top view of the microlenses 106, the n-type semiconductor regions 103B, and the n-type semiconductor regions 105B. As illustrated in FIG. 9B, each microlens 106 overlaps two n-type semiconductor region 103B adjoining each other in the left-to-right direction in the drawing. When viewed from the top, the edge of one microlens 106 intersects two n-type semiconductor regions 105B.

Figure 9C:
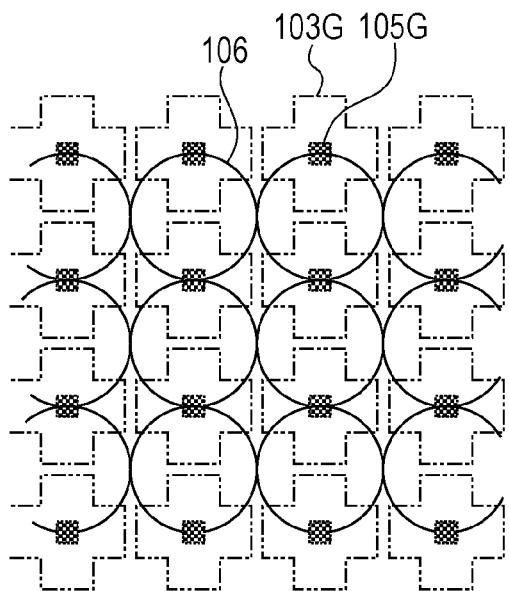
FIG. 9C is a schematic top view of photo detectors and microlenses corresponding to green light according to the seventh embodiment.

FIG. 9C is a top view of the microlenses 106, the n-type semiconductor regions 103G, and the n-type semiconductor regions 105G. The n-type semiconductor regions 103G surround the areas where the n-type semiconductor regions 105B are provided. Each microlens 106 overlaps two n-type semiconductor regions 103G adjoining each other in the top-to-bottom direction in the drawing. When viewed from the top, the edge of one microlens 106 intersects two n-type semiconductor regions 105G.

Figure 9D:
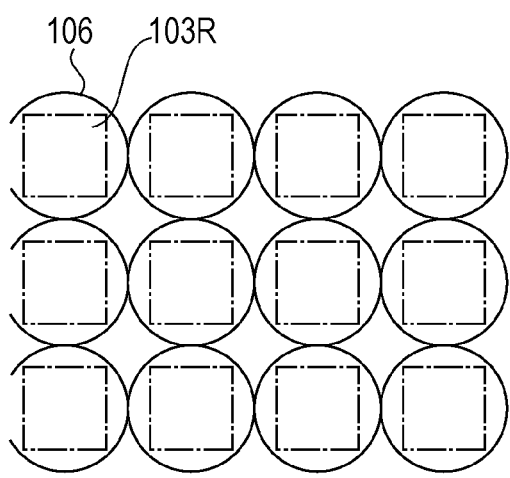
FIG. 9D is a schematic top view of photo detectors and microlenses corresponding to red light according to the seventh embodiment.

FIG. 9D is a top view of the microlenses 106 and the n-type semiconductor regions 103R. As illustrated in FIG. 9D, the centers of the microlenses 106 match the centers of the n-type semiconductor regions 103R.

As illustrated in FIG. 9A, the n-type semiconductor regions 105B and 105G are disposed at the centers of the n-type semiconductor regions 103B 103G, respectively. When viewed from the top, the n-type semiconductor regions 105B and the n-type semiconductor regions 103G are positioned such that they form a tetragonal face-centered lattice. That is, four n-type semiconductor regions 105B are positioned at the apices of a regular tetragon with one n-type semiconductor region 105G positioned at the center. Each of the four n-type semiconductor regions 105B are also positioned at the center of a regular tetragon with four n-type semiconductor regions 105G at the apices. The peripheral pixels are not limited such positional relationship.

With such a configuration, the distance between adjoining readout portions can be increased. It is desirable that the impurity concentration of the n-type semiconductor regions 105B and 105G, which are readout portions, be high. When impurity concentration is high, impurities diffuse more easily. Furthermore, a high impurity concentration increases the spreading of the depletion layer in the p-type semiconductor region 104 in the vicinity. Accordingly, when the distance between the n-type semiconductor region 105B and the n-type semiconductor region 105G is small, these regions may become electrically conductive. Thus, it is desirable that the distance between adjoining readout portions be large.

FIG. 10 illustrates the potential distribution in the horizontal direction along line E in FIG. 9B and at a depth corresponding to the position of the n-type semiconductor regions 103B. The vertical axis represents the potential of electrons, and the horizontal axis represents the horizontal position.

In this embodiment, two of the n-type semiconductor regions 103B are disposed below one microlens 106. Therefore, a potential barrier formed between adjoining n-type semiconductor regions 103B is positioned below the microlens 106. In FIG. 10, the potential barrier is positioned at the center of the microlens 106. When light focused by the microlens 106 is photo-electrically converted, the generated carriers are collected to one of the adjoining n-type semiconductor regions 103B on the left and right sides in FIG. 10.

In this embodiment, one microlens 106 corresponds to one pixel. Thus, to acquire a blue signal from one pixel, the average value of signals from adjoining n-type semiconductor regions 103B on the left and right sides in FIG. 9B may be determined. Similarly, to acquire a green signal from one pixel, the average value of signals from adjoining n-type semiconductor regions 103G on the upper and lower sides in FIG. 9C may be determined.

In this embodiment, a pixel includes two n-type semiconductor regions 103B while sharing them with the pixels on the left and right. Similarly, a pixel includes two n-type semiconductor regions 103G while sharing them with the pixels above and below.

The edge of the microlens 106 intersects the n-type semiconductor regions 105B and 105G, which are readout portions. With such a configuration, each pixel shares readout portions with adjoining pixels.

FIGS. 9A, 9B, 9C, 9D, and 10 illustrate a configuration in which microlenses 106, which are similar to those in the first embodiment, are disposed on the back surface. This embodiment is not limited thereto and may employ other embodiments.

As described above, in addition to the advantages of the first to sixth embodiments, this embodiment has the following advantage.

With this embodiment, the distance between the n-type semiconductor regions 105B and 105G can be set large. With such a configuration, the electric conductivity between the n-type semiconductor regions 105B and 105G can be reduced, and thus, the color separation characteristic is improved even more.

Eighth Embodiment

Figure 11:
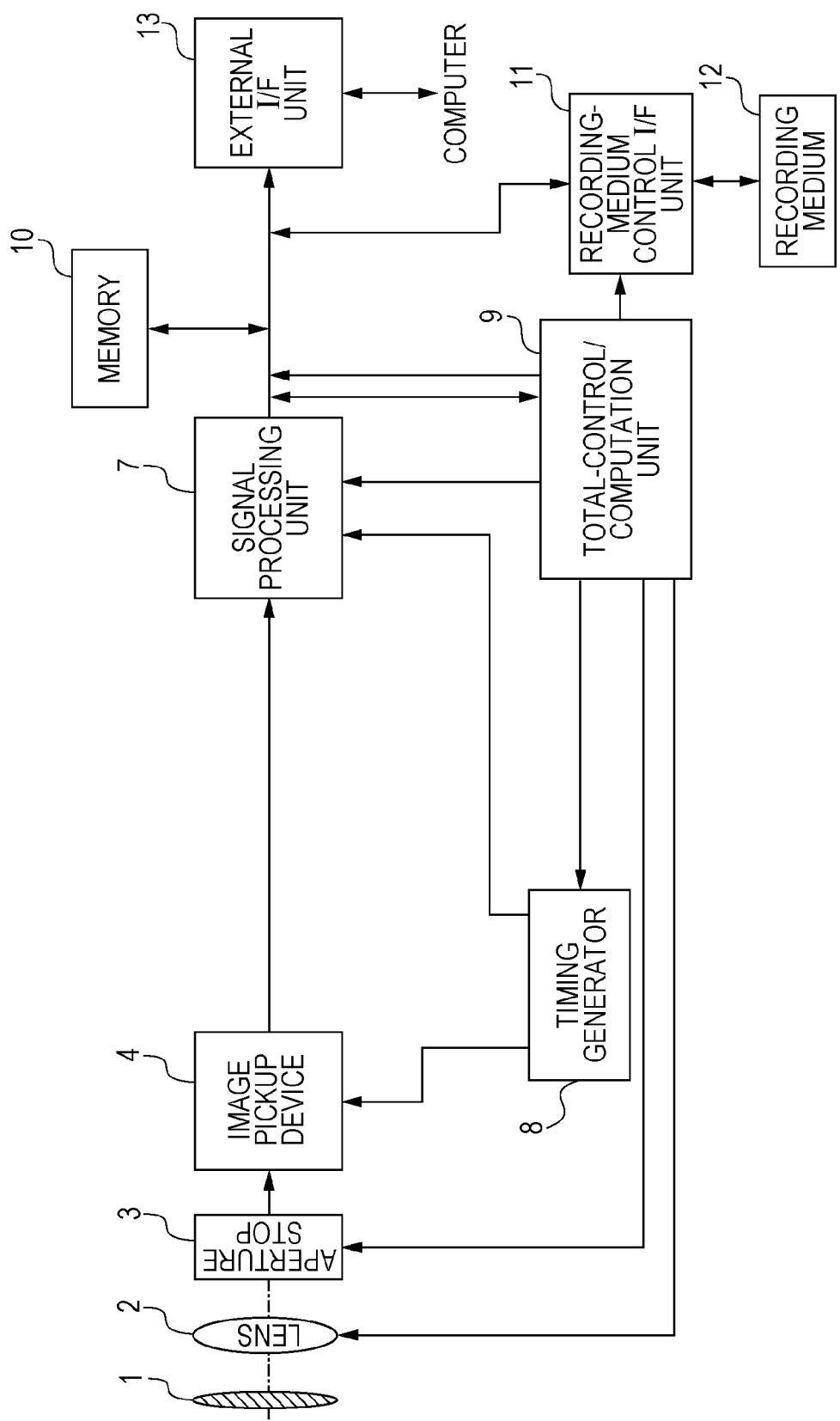
FIG. 11 is a camera system according to an embodiment.

A camera system including a solid-state image pickup apparatus according to an embodiment of present invention will be described in detail. Examples of an image pickup system include digital still cameras and digital camcorders. FIG. 11 is a block diagram illustrating an example image pickup system in which a photoelectric conversion apparatus is applied to a digital still camera.

FIG. 11 illustrates a barrier 1 that protects a lens 2, which forms an optical image of a subject on a solid-state image pickup apparatus 4, and an aperture stop 3 that varies the amount of light transmitted through the lens 2. The solid-state image pickup apparatus 4 is solid-state image pickup apparatuses of one of the embodiments described above and converts an optical image formed by the 2 to image data. The substrate of the solid-state image pickup apparatus 4 is provided with an A/D converter. A signal processing unit 7 performs various corrections on image pickup data output from the solid-state image pickup apparatus 4 and compresses data. FIG. 11 also illustrates a timing generator 8 that outputs various timing signals to the solid-state image pickup apparatus 4 and the signal processing unit 7, and a total control/computation unit 9 that performs various computations and controls the entire digital still camera. Image data is temporarily stored in a memory 10. An interface unit 11 is used to record to and read out from a recording medium. A detachable recording medium, such as a semiconductor memory, is used to record and read out image pickup data. An interface unit 13 is used to communicate with an external computer, etc. The timing signals may be input from a unit outside the image pickup system, so long as the image pickup system includes at least the solid-state image pickup apparatus 4 and the signal processing unit 7 that processes the image pickup signal output from the solid-state image pickup apparatus 4.

In this embodiment, the solid-state image pickup apparatus 4 and the A/D converter are provided on the same substrate. Instead, however, the solid-state image pickup apparatus 4 and the A/D converter may be provided on separate substrates. Furthermore, the solid-state image pickup apparatus 4 and the signal processing unit 7 may be provided on the same substrate.

As described above, the solid-state image pickup apparatus according to an embodiment of the present invention can be applied to a camera system. By applying the solid-state image pickup apparatus according to the present invention to a camera system, an image having improved color separation characteristic can be captured.

In each embodiment, a solid-state image pickup apparatus having three photo detectors is described. However, the present invention can be applied so long as a plurality of stacked photo detectors is included. For example, the present invention can be applied to a back-illuminated solid-state image pickup apparatus having two stacked photo detectors.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST 101 semiconductor substrate
102 circuit portion
103 n-type semiconductor region
104 p-type semiconductor region
105 n-type semiconductor region
106 microlens
107 light-shielding portion
108 optical waveguide
109 core portion
110 clad portion
111 pillar-type microlens
112 air gap
113 depletion layer

The invention claimed is:

1. A solid-state image pickup apparatus comprising:
a semiconductor substrate including a plurality of pixels, each pixel including a photo detector and a readout portion;
a wire disposed on a first main surface of the semiconductor substrate; and
a plurality of microlenses disposed on a second main surface of the semiconductor substrate opposite to the first main surface,
wherein the photo detector includes a first photo detector unit and a second photo detector unit disposed deeper than the first photo detector unit with respect to the second main surface,
wherein the first photo detector unit includes a first-conductive-type first semiconductor region,
wherein the readout portion includes a first-conductive-type second semiconductor region extending in a depth direction of the semiconductor substrate from the first semiconductor region to the first main surface, and
wherein, in a planar view with respect to the second main surface, a part of the second semiconductor region is disposed between two adjacent microlenses of the plurality of microlenses, and one of the two adjacent microlenses overlaps a part of the second semiconductor region.

2. The solid-state image pickup apparatus according to claim 1, wherein the projection of the edge of the at least one of the two adjacent microlenses in the depth direction intersects at least two of the second semiconductor regions corresponding to two of the first semiconductor regions respectively included in two adjacent pixels of the plurality of pixels.

3. The solid-state image pickup apparatus according to claim 1, further comprising:
a light-shielding portion disposed on the second main surface of the semiconductor substrate and configured to block light,
wherein the light-shielding portion is disposed such that a projection of the light-shielding portion in the depth direction overlaps the second semiconductor region.

4. The solid-state image pickup apparatus according to claim 1, further comprising:
an optical waveguide disposed on the second main surface of the semiconductor substrate and including a clad portion and a core portion,
wherein the optical waveguide is disposed such that a projection of the clad portion in the depth direction overlaps the second semiconductor region.

5. The solid-state image pickup apparatus according to claim 1, wherein, among the pixels, the first semiconductor region included in a pixel is electrically conductive with the first semiconductor region included in an adjoining pixel.

6. The solid-state image pickup apparatus according to claim 1,
wherein the photo detector further includes a third photo detector unit disposed at a depth between the depth of the first photo detector unit and the depth of the second photo detector unit,
wherein the third photo detector unit includes a first-conductivity-type third semiconductor region, and
wherein the readout portion includes a first-conductivity-type fourth semiconductor region extending in the depth direction of the semiconductor substrate from the third semiconductor region to the first main surface.

7. The solid-state image pickup apparatus according to claim 1,
wherein the center of the one of the two adjacent microlenses substantially matches the center of the first semiconductor region in the planar view.

8. An image pickup system comprising:
the solid-state image pickup apparatus according to claim 1; and
a signal processing unit configured to process an image pickup signal output from the solid-state image pickup apparatus.

9. A solid-state image pickup apparatus comprising:
a semiconductor substrate including a plurality of pixels, each pixel including a photo detector and a readout portion;
a wire disposed on a first main surface of the semiconductor substrate; and
a microlens layer disposed on a second main surface of the semiconductor substrate opposite to the first main surface, including a plurality of microlenses, and having a recess portion in a sectional view,
wherein the photo detector includes a first photo detector unit and a second photo detector unit disposed deeper than the first photo detector unit with respect to the second main surface,
wherein the first photo detector unit includes a first-conductive-type first semiconductor region,
wherein the readout portion includes a first-conductive-type second semiconductor region extending in a depth direction of the semiconductor substrate from the first semiconductor region to the first main surface, and
wherein a projection of a bottom of the recess portion in the depth direction intersects the second semiconductor region.

10. The solid-state image pickup apparatus according to claim 9, wherein, among the pixels, the first semiconductor region included in a pixel is electrically conductive with the first semiconductor region included in an adjoining pixel.

11. The solid-state image pickup apparatus according to claim 9,
wherein the photo detector further includes a third photo detector unit disposed at a depth between the depth of the first photo detector unit and the depth of the second photo detector unit,
wherein the third photo detector unit includes a first-conductivity-type third semiconductor region, and
wherein the readout portion includes a first-conductivity-type fourth semiconductor region extending in the depth direction of the semiconductor substrate from the third semiconductor region to the first main surface.

12. The solid-state image pickup apparatus according to claim 9,
wherein at least two of the plurality of microlenses forms the recess portion, and
wherein the center of one of the at least two of the plurality of microlenses substantially matches the center of the first semiconductor region in a planar view with respect to the second main surface.

13. An image pickup system comprising:
the solid-state image pickup apparatus according to claim 9; and
a signal processing unit configured to process an image pickup signal output from the solid-state image pickup apparatus.

14. A solid-state image pickup apparatus comprising:
a semiconductor substrate including a plurality of pixels, each pixel including a photo detector and a readout portion;
a wire disposed on a first main surface of the semiconductor substrate;
a microlens configured to focus light and disposed on a second main surface of the semiconductor substrate opposite to the first main surface; and
a light-shielding portion disposed on the second main surface of the semiconductor substrate and configured to block light,
wherein the photo detector includes a first photo detector unit and a second photo detector unit disposed deeper than the first photo detector unit with respect to the second main surface,
wherein the first photo detector unit includes a first-conductive-type first semiconductor region,
wherein the readout portion includes a first-conductive-type second semiconductor region extending in a depth direction of the semiconductor substrate from the first semiconductor region to the first main surface, and
wherein a projection of the light-shielding portion in the depth direction overlaps the second semiconductor region.

15. The solid-state image pickup apparatus according to claim 14, wherein, among the pixels, the first semiconductor region included in a pixel is electrically conductive with the first semiconductor region included in an adjoining pixel.

16. The solid-state image pickup apparatus according to claim 14,
wherein the photo detector further includes a third photo detector unit disposed at a depth between the depth of the first photo detector unit and the depth of the second photo detector unit,
wherein the third photo detector unit includes a first-conductivity-type third semiconductor region, and
wherein the readout portion includes a first-conductivity-type fourth semiconductor region extending in the depth direction of the semiconductor substrate from the third semiconductor region to the first main surface.

17. The solid-state image pickup apparatus according to claim 14, wherein the center of the microlens substantially matches the center of the first semiconductor region in a planar view with respect to the second main surface.

18. An image pickup system comprising:
the solid-state image pickup apparatus according to claim 14; and
a signal processing unit configured to process an image pickup signal output from the solid-state image pickup apparatus.

19. The solid-state image pickup apparatus according to claim 9, further comprising:
a light-shielding portion disposed on the second main surface of the semiconductor substrate and configured to block light,
wherein the light-shielding portion is disposed such that a projection of the light-shielding portion in the depth direction overlaps the second semiconductor region.

* * * * *